(12) United States Patent
Yeh et al.

(10) Patent No.: US 7,321,145 B2
(45) Date of Patent: Jan. 22, 2008

(54) METHOD AND APPARATUS FOR OPERATING NONVOLATILE MEMORY CELLS WITH MODIFIED BAND STRUCTURE

(75) Inventors: Chih Chieh Yeh, Taipei (TW); Wen Jer Tsai, Hualien (TW)

(73) Assignee: Macronix International Co., Ltd., Hsinchu (TW)

( * ) Notice: Subject to any disclaimer, the term of this patent is extended or adjusted under 35 U.S.C. 154(b) by 106 days.

(21) Appl. No.: 11/249,832

(22) Filed: Oct. 13, 2005

(65) Prior Publication Data

US 2007/0087482 A1    Apr. 19, 2007

(51) Int. Cl.
H01L 27/108 (2006.01)
H01L 29/76 (2006.01)
H01L 29/94 (2006.01)
H01L 31/119 (2006.01)

(52) U.S. Cl. .................. 257/296; 257/68; 257/E21; 257/92; 257/127; 257/646; 257/662

(58) Field of Classification Search ................ 257/296, 257/19, 63, 68, 305, 310, 312, 315, 382, 257/410, 411, 710, 760; 438/257, 289
See application file for complete search history.

(56) References Cited

U.S. PATENT DOCUMENTS

| | | | | |
|---|---|---|---|---|
| 5,768,192 | A * | 6/1998 | Eitan | 365/185.24 |
| 5,814,853 | A | 9/1998 | Chen | |
| 6,011,725 | A * | 1/2000 | Eitan | 365/185.33 |
| 6,160,286 | A | 12/2000 | Chi | |
| 6,215,702 | B1 * | 4/2001 | Derhacobian et al. | 365/185.29 |
| 6,404,681 | B1 * | 6/2002 | Hirano | 365/185.33 |
| 6,487,114 | B2 * | 11/2002 | Jong et al. | 365/185.03 |
| 6,487,121 | B1 * | 11/2002 | Thurgate et al. | 365/185.18 |
| 6,509,587 | B2 | 1/2003 | Sugiyama et al. | |
| 6,649,492 | B2 * | 11/2003 | Chu et al. | 438/478 |
| 6,690,601 | B2 * | 2/2004 | Yeh et al. | 365/185.28 |
| 6,784,480 | B2 | 8/2004 | Bhattacharyya | |

OTHER PUBLICATIONS

Ya-Chin King et al. "Charge-Trap Memory Device Fabricated by Oxidation of $Si_{1-x}Ge_x$," IEEE Tranactions on Electron Devices, vol. 48, No. 4, Apr. 2001, pp. 696-700.

Jing Hao Chen et al. "Nonvolatile Flash Memory Device Using Ge Nanocrystals Embedded in HfAlO High-k Tunneling and Control Oxides: Device Fabrication and Electrical Performance" IEEE Tranactions on Electron Devices, vol. 51, No. 11, Nov. 2004, pp. 1840-1848.

Guofu Niu "SiGe Technology for Revolution of Personal Communications" http://www.eng.auburn.edu-guofu/sige_intro.htm Sep. 2002, consisting of 5 pages.

* cited by examiner

*Primary Examiner*—David Nhu
(74) *Attorney, Agent, or Firm*—Kenta Suzue; Haynes Beffel & Wolfeld LLP

(57) ABSTRACT

A nonvolatile memory cell with a charge storage structure is read by measuring current (such as band-to-band current) between the substrate region of the memory cell and at least one of the current carrying nodes of the memory cell. To enhance the operation of the nonvolatile memory cell, the band structure engineering is used to alter the band structure between a bulk part of the device and another part of the device supporting the measurement current.

22 Claims, 12 Drawing Sheets

METHOD AND APPARATUS FOR OPERATING NONVOLATILE MEMORY CELLS WITH MODIFIED BAND STRUCTURE

BACKGROUND OF THE INVENTION

1. Field of the Invention

The present invention relates to electrically programmable and erasable non-volatile memory, and more particularly to charge storage memory with a bias arrangement that reads the contents of the charge storage structure of the memory cell with great sensitivity, aided by band structure engineering.

2. Description of Related Art

Electrically programmable and erasable non-volatile memory technologies based on charge storage structures known as EEPROM and flash memory are used in a variety of modern applications. A number of memory cell structures are used for EEPROM and flash memory. As the dimensions of integrated circuits shrink, greater interest is arising for memory cell structures based on charge storage structures such as charge trapping dielectric layers, because of the scalability and simplicity of the manufacturing processes. Various memory cell structures based on charge trapping dielectric layers include structures known by the industry names PHINES, NROM, and SONOS, for example. These memory cell structures store data by trapping charge in a charge trapping dielectric layer, such as silicon nitride. As more net negative charge is trapped, the threshold voltage of the memory cell increases. The threshold voltage of the memory cell is reduced by removing negative charge from, or adding positive charge to, the charge trapping layer.

Conventional memory cell structures rely on the reverse read operation to determine the contents of the memory structure. However, the reverse read technique effectively couples together multiple locations of the charge storage structure, even when only a portion of the charge storage structure contains data of interest. This dependence constrains the utility of using the charge storage structures as nonvolatile memory, by narrowing the sensing window of currents measured from the reverse read technique. Less data are stored in the charge storage structure than otherwise possible.

Power consumption is another area of potential improvement. Portable electronic devices such as music players, cell phones, and wireless devices, have a limited source of power available. The reverse read operation is a source of power drain contributing to power consumption. Similarly, such power consumption occurs in read operations that rely on contrasting levels of lateral current flow through a channel formed in the memory cell.

Thus, a need exists for a nonvolatile memory cell that can be read without suffering substantial coupling between multiple locations of the charge storage structure, even when only a portion of the charge storage structure contains data of interest. Alternately, a need exists for a read operation that reduces power consumption, compared to the reverse read operation.

SUMMARY OF THE INVENTION

A nonvolatile memory includes a charge storage structure storing data as charge storage states, a substrate region including source and drain regions, one or more dielectric structures, a gate that provides a gate voltage to the memory cell, and logic circuitry which controls the bias applied to the nonvolatile memory cell. The substrate region has a bulk part with a first band structure and a measurement part with a second band structure different from the first band structure. The bias applied by the logic determines a charge storage state of the charge storage structure and measures current flowing between the substrate region and at least one of the source region or the drain region to determine the charge storage state of the charge storage structure. In the measurement, at least part of the current flows through the measurement part of the substrate region.

An example of different band structure is different bandgaps. In some embodiments the first band structure of the bulk part of the substrate is associated with a first bandgap, the second band structure of the measurement part of the substrate is associated with a second bandgap, and the second bandgap is less than the first bandgap. Because of the different bandgaps, a read operation controlled by the logic measures a larger magnitude of current. Another example is the position of the valence band and/or conduction band. If a material has a lower electron barrier, electron injection mechanisms are enhanced; for example, the efficiency of channel hot electrons for programming can be increased in an NROM memory operation. If a material has a lower hole barrier, hole injection mechanisms are enhanced; for example, the efficiency of band-to-band hot holes for programming can be increased in a PHINES memory operation.

Various embodiments result in the different band structure in the bulk part and the measurement part of the substrate. For example, the measurement part of the substrate region can include strained silicon, such as strained silicon induced by a film causing the strain. The measurement part of the substrate region also can include $Si_xGe_{1-x}$ material or $Si_xC_{1-x}$ material. The bulk substrate is generally silicon due to low cost, though other bulk substrates such as germanium can be used.

Various embodiments alter the position of the measurement part of the substrate. For example, the measurement part of the substrate region can include the source and drain regions, or a channel part between the source and drain regions, or both the channel part and the source and drain regions. In some embodiments, the substrate region has a buried oxide at least partly between the bulk part and the measurement part.

During a read operation, the measured current flowing between at least one of the current carrying nodes (source and drain) and the substrate region, includes a band-to-band tunneling current to determine the charge storage state. To induce the band-to-band tunneling current, the read bias arrangement controlled by the logic causes a first voltage difference between the gate and one of the current carrying nodes, and a second voltage difference between another of the current carrying nodes and the substrate region.

Because the read operation does not require a current to flow between the first and second current carrying nodes (source and drain) of the measured nonvolatile memory cells, the read bias arrangement allows for one region of the current carrying regions (source and drain) to be floated, while another region of the current carrying regions is biased to have a voltage difference with the substrate region.

The voltage difference between the gate and at least one of the current carrying regions (source and drain) creates an electric field which causes band bending in the same region(s). The degree of band bending is affected by the charge storage state of the charge storage structure, resulting in a band-to-band tunneling current in at least one of the current carrying regions that varies with the charge storage state. In a read operation, the voltage differences fail to change the charge storage state. In some embodiments, the bias arrangement applies a reverse bias voltage difference between the substrate region and the current carrying region (s), and floats another of the current carrying region.

In some embodiments, the substrate region is a well in a semiconductor substrate. In other embodiments, the substrate region is simply the semiconductor substrate.

The one or more dielectric structures are at least partly between the charge storage structure and the substrate region and at least partly between the charge storage structure and a source of gate voltage.

In one embodiment, the nonvolatile memory cell has a split gate design, and includes a second gate. In memory operations, the different gates each apply a potential to the substrate region. With this split gate design, the logic applies erase and programming bias arrangements to change the charge storage state by injecting electrons into and ejecting electrons from corresponding parts of the charge storage structures.

In other embodiments, the nonvolatile memory cell has a floating gate design or a nanocrystal design. With this floating gate design or nanocrystal design, the logic applies erase and programming bias arrangements to change the charge storage state by injecting electrons into and ejecting electrons from corresponding parts of the charge storage structures.

In another embodiment, the nonvolatile memory cell has a charge trapping material design. With this charge trapping material design, the logic applies erase and programming bias arrangements to change the charge storage state by injecting electrons into and injection holes into corresponding parts of the charge storage structures.

In some embodiments, the logic applies a second bias arrangement to adjust the charge storage state by increasing a net positive charge in the charge storage structure, and applies a third bias arrangement to adjust the charge storage state by increasing a net negative charge in the charge storage structure. In some embodiments, the second bias arrangement corresponds to programming and the third bias arrangement corresponds to erasing, and in other embodiments the second bias arrangement corresponds to erasing and the third bias arrangement correspond to programming. As generally used herein, programming refers to adding limited amounts of charge in the charge storage structure, such as by the addition of holes or electrons to the charge storage structure. Also as generally used herein, erasing refers to resetting the charge storage state of the charge storage structure, such as by adding a single charge type throughout the charge storage structure until equilibrium is reached. The invention encompasses both products and methods where programming refers to making the net charge stored in the charge storage structure more negative or more positive, and products and methods where erasing refers to making the net charge stored in the charge storage structure more negative or more positive.

Net positive charge is increased in the charge storage structure via current mechanisms such as band-to-band hot hole tunneling, for example from the gate or substrate region (such as the source region or drain region). Net negative charge is increased in the charge storage structure via current mechanisms such as electron tunneling, Fowler-Nordheim tunneling, channel hot electron injection current, and channel initiated secondary electron injection current, for example from the gate or substrate region (such as the source region or drain region). In one embodiment, the net positive charge in the charge storage structure is increased via band-to-band hot hole tunneling, and the net negative charge is increased in the charge storage structure via channel hot electron injection current.

The charge storage state of the charge storage structure stores one bit or multiple bits, depending on the material of the charge storage structure and the number of distinct threshold voltages that can be distinguished in the charge storage structure.

A method of operating a nonvolatile memory array, an architecture for an integrated circuit including such a nonvolatile memory array, and a manufacturing method for an integrated circuit including such nonvolatile memory cells, are disclosed.

Other embodiments of the technology described above include a method for operating the nonvolatile memory array, and a column of the nonvolatile memory according to the described technology.

Other aspects and advantages of the technology presented herein can be understood with reference to the figures, the detailed description and the claims, which follow.

Various embodiments include memory cells with an n-type channel, memory cells with a p-type channel, or memory cells with an n-type (gate?) and memory cells with a p-type (gate?).

DETAILED DESCRIPTION

Figure 1A:
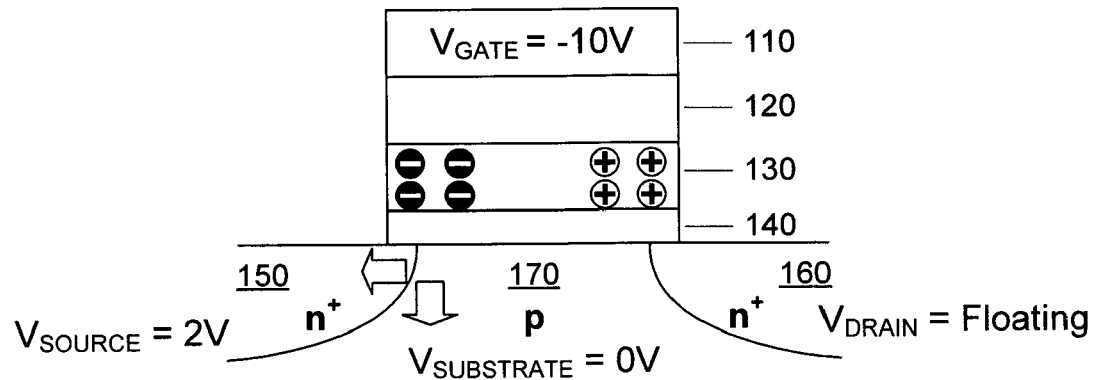
FIG. 1A is a simplified diagram of a charge trapping memory cell, showing a read operation being performed on the portion of the charge trapping structure corresponding to the source side.

FIG. 1A is a simplified diagram of a charge trapping memory cell, showing a read operation being performed on the portion of the charge trapping structure corresponding to the source side. The p-doped substrate region 170 includes n+ doped source and drain regions 150 and 160. The remainder of the memory cell includes a bottom dielectric structure 140 on the substrate, a charge trapping structure 130 on the bottom dielectric structure 140 (bottom oxide), a top dielectric structure 120 (top oxide) on the charge trapping structure 130, and a gate 110 on the oxide structure 120. Representative top dielectrics include silicon dioxide and silicon oxynitride having a thickness of about 5 to 10 nanometers, or other similar high dielectric constant materials including for example $Al_2O_3$. Representative bottom dielectrics include silicon dioxide and silicon oxynitride having a thickness of about 3 to 10 nanometers, or other similar high dielectric constant materials. Representative charge trapping structures include silicon nitride having a thickness of about 3 to 9 nanometers, or other similar high dielectric constant materials, including metal oxides such as $Al_2O_3$, $HfO_2$, and others.

The memory cell for SONOS-like cells has, for example, a bottom oxide with a thickness ranging from 2 nanometers to 10 nanometers, a charge trapping layer with a thickness ranging from 2 nanometers to 10 nanometers, and a top oxide with a thickness ranging from 2 nanometers to 15 nanometers. Other charge trapping memory cells are PHINES and NROM.

In some embodiments, the gate comprises a material having a work function greater than the intrinsic work function of n-type silicon, or greater than about 4.1 eV, and preferably greater than about 4.25 eV, including for example greater than about 5 eV. Representative gate materials include p-type poly, TiN, Pt, and other high work function metals and materials. Other materials having a relatively high work function suitable for embodiments of the technology include metals including but not limited to Ru, Ir, Ni, and Co, metal alloys including but not limited to Ru—Ti and Ni—T, metal nitrides, and metal oxides including but not limited to $RuO_2$. High work function gate materials result in higher injection barriers for electron tunneling than that of the typical n-type polysilicon gate. The injection barrier for n-type polysilicon gates with silicon dioxide as the top dielectric is around 3.15 eV. Thus, embodiments of the present technology use materials for the gate and for the top dielectric having an injection barrier higher than about 3.15 eV, such as higher than about 3.4 eV, and preferably higher than about 4 eV. For p-type polysilicon gates with silicon dioxide top dielectrics, the injection barrier is about 4.25 eV, and the resulting threshold of a converged cell is reduced about 2 volts relative to a cell having an n-type polysilicon gate with a silicon dioxide top dielectric.

In the diagram of FIG. 1A, the source side of the memory cell stores added electrons, for example via a channel reset operation injecting electrons via Fowler-Nordheim tunneling from the gate 110 or the substrate 170, or some other charge movement process such as channel hot electron injection or channel initiated secondary electron injection. The drain side of the memory cell stores added holes, for example via band-to-band hole injection into the drain side of the charge trapping structure 130.

Figure 1B:
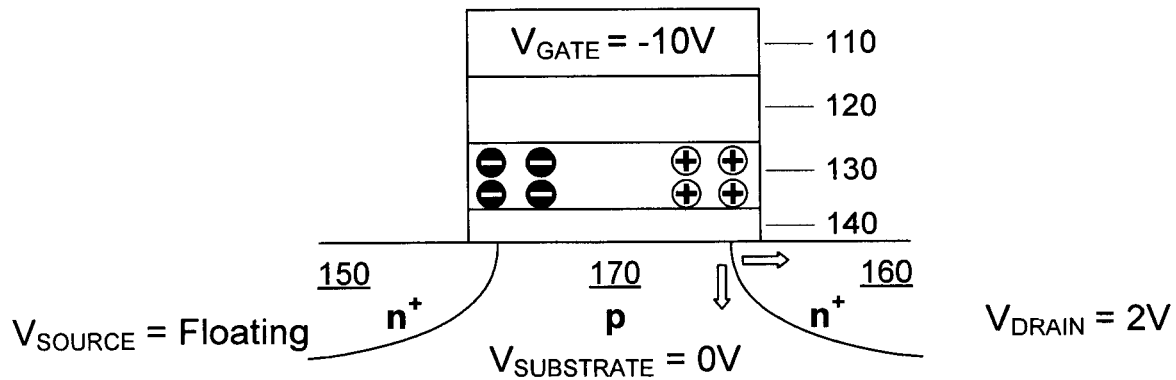
FIG. 1B is a simplified diagram of a charge trapping memory cell, showing a read operation being performed on the portion of the charge trapping structure corresponding to the drain side.

In the bias arrangement of FIG. 1A for reading the source side of the charge trapping structure 130, the voltage of the gate 110 is −10 V, the voltage of the source 150 is 2 V, the voltage of the drain 160 is floating, and the voltage of the substrate 170 is 0 V. The memory cell of FIG. 1B is similar to memory cell of FIG. 1A, except that a read operation is being performed on the drain side of the charge trapping structure rather than on the source side. In the bias arrangement of FIG. 1B for reading the drain side of the charge trapping structure 130, the voltage of the gate 110 is −10 V, the voltage of the source 150 is floating, the voltage of the drain 160 is 2 V, and the voltage of the substrate 170 is 0 V. The bias arrangement is determined among the various terminals, such that the energy bands bend sufficiently to cause band-to-band current in the n+ doped source 150 (FIG. 1A) or the n+ doped drain 160 (FIG. 1B), but to keep the potential difference between the substrate 170 and the source 150 (FIG. 1A) or the drain 160 (FIG. 1B) low enough that programming or erasing does not occur, as discussed in connection with FIG. 3A, 3B, 4A, 4B, 6, and 7.

In this bias arrangements of FIGS. 1A and 1B, the area of the junction between the p doped substrate 170, and either the n+doped source 150 or the n+ doped drain 160, displays the behavior of a reverse biased p-n junction. However, the gate voltage causes the energy bands to bend sufficiently such that band-to-band tunneling occurs through the n+doped source 150 (FIG. 1A) or the n+doped drain 160 (FIG. 1B). The high doping concentration in the source 150 or the drain 160, the resulting high charge density of the space charge region, and the accompanying short length of the space charge region over which the voltage changes, contribute to the sharp energy band bending. Electrons in the valence band tunnel through the forbidden gap to the conduction band and drift down the potential hill, deeper into either the n+ doped source 150 (FIG. 1A) or the n+ doped drain 160 (FIG. 1B). Similarly, holes drift up the potential hill, away from either the n+ doped source 150 (FIG. 1A) or the n+ doped drain 160 (FIG. 1B), and toward the p doped substrate 170.

The voltage of the gate 110 controls the voltage of the portion of the substrate 170 by the bottom dielectric structure 140 (bottom oxide). In turn, the voltage of the portion of the substrate 170 by the bottom dielectric structure 140 (bottom oxide) controls the degree of band bending between the bottom dielectric structure 140 (bottom oxide), and either the n+ doped source 150 (FIG. 1A) or the n+ doped drain 160 (FIG. 1B). As the voltage of the gate 110 becomes more negative, the voltage of the portion of the substrate 170 by the bottom dielectric structure 140 (bottom oxide) becomes more negative, resulting in deeper band bending in either the n+ doped source 150 (FIG. 1A) or the n+ doped drain 160 (FIG. 1B). More band-to-band current flows, as a result of at least some combination of 1) an increasing overlap between occupied electron energy levels on one side of the bending energy bands, and unoccupied electron energy levels on the other side of bending energy bands, and 2) a narrower barrier width between the occupied electron energy levels and the unoccupied electron energy levels (Sze, *Physics of Semiconductor Devices*, 1981).

As mentioned above, the drain side of the charge trapping structure 130 is occupied by relatively more holes, whereas the source side of the charge trapping structure 130 is occupied by relatively more electrons than the drain side of the charge trapping structure 130. As a result, in accordance with Gauss's Law, when −10 V is applied to the gate 110, the bottom dielectric structure 140 (bottom oxide) is biased more negatively on the source side than on the drain side. Thus, more current flows between the source 150 and the substrate 170 in the bias arrangement shown in FIG. 1A for reading the source side of the charge trapping structure 130 than flows between the drain 160 and the substrate 170 in the bias arrangement shown in FIG. 1B for reading the drain side of the charge trapping structure 130.

The difference in the bias arrangements of FIGS. 1A and 1B for reading, and the bias arrangement of FIGS. 3A, 3B, 4A, and 4B for programming and erasing, show a careful balance. For reading, the potential difference between the source region and the drain region should not cause a substantial number of carriers to transit the tunnel oxide and affect the charge storage state. In contrast, for programming and erasing, the potential difference between the source region and the drain region is sufficient to cause a substantial number of carriers to transit the tunnel oxide and affect the charge storage state.

Figure 2A:
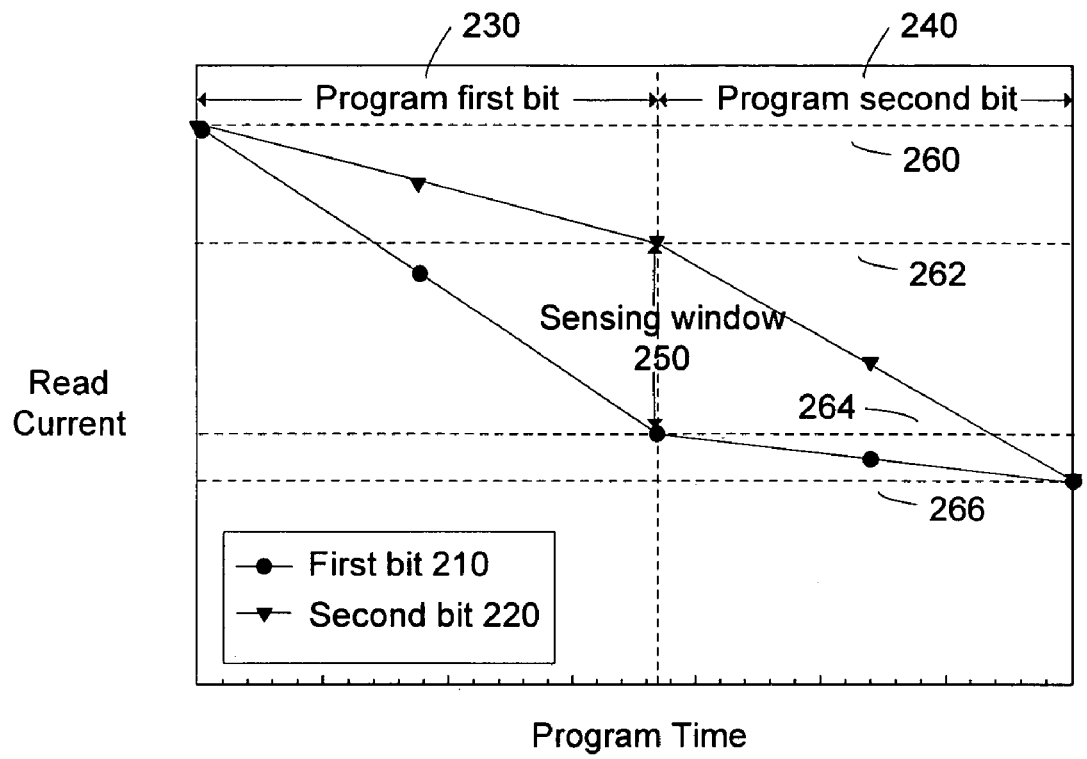
FIG. 2A is a graph showing the sensing window of a typical nonvolatile memory cell.

FIG. 2A is a graph showing the sensing window of a typical nonvolatile memory cell. In FIG. 2A, the memory cell read by a reverse read operation has a relatively narrow sensing window 250 due to the second bit effect. During the time interval 230, as the first bit is undergoing programming, the read current curve of the first bit 210 increases from a lowest level 260 to a high level 264. Consequently, the programming of the first bit during the time interval 230 substantially affects the read current curve of the second bit 220, which increases from a lowest level 260 to a low level 262. During the time interval 240, as the second bit is undergoing programming, the read current curve of the second bit 220 increases from a low level 262 to a highest level 266. Consequently, the programming of the second bit during the time interval 240 substantially affects the read current curve of the first bit 210, which increases from a high level 264 to a highest level 266. Thus, when performing a reverse read operation on a memory cell on one bit, the resulting read current is substantially affected by the programmed or erased status of the other bit, because for a given gate voltage it becomes more difficult during the reverse read operation to force the substrate portion under the other bit into depletion and inversion, and to punch through the portion of the substrate under the other bit.

Figure 2B:
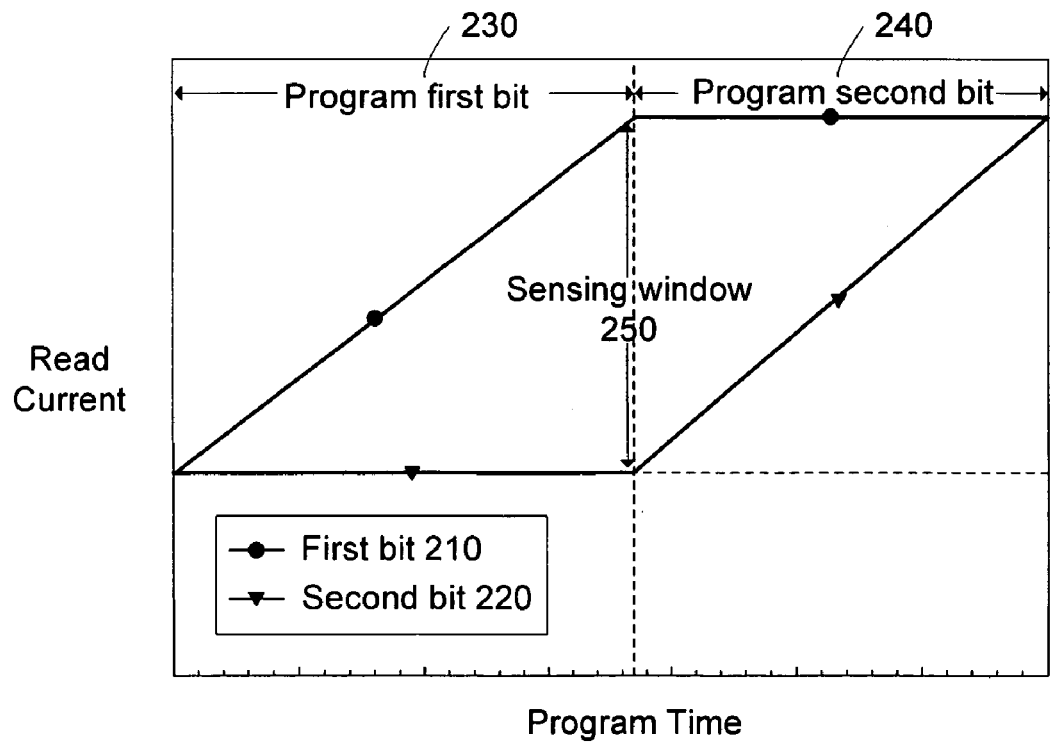
FIG. 2B is a graph showing the sensing window of a memory cell as a program operation is performed on different parts of the charge trapping structure of the memory cell.

FIG. 2B is a graph showing the sensing window of a memory cell as a program operation is performed on different parts of the charge trapping structure of the memory cell. In the graph of FIG. 2B, the first and second charge trapping parts undergo programming. Curve 210 represents the read current of the first charge trapping part. Curve 220 represents the read current of the second charge trapping part. The sensing window 250 shown in FIG. 2B is relatively wide, because the band-to-band read operation is local to either the first terminal or the second terminal. The read current resulting from a band-to-band read operation performed on the first charge trapping part is relatively insensitive to the logical state of the second charge trapping part, and the read current resulting from a band-to-band read operation performed on the second charge trapping part is relatively insensitive to the logical state of the first charge trapping part. The band-to-band read operation is relatively free of the second charge trapping part effect which characterizes the reverse read operation, where the read current resulting from a read operation performed on one side of the charge trapping structure is relatively dependent on the data stored on the other side of the charge trapping structure.

Each charge trapping part can store one bit or multiple bits. For example, if each charge trapping part stores two bits, then there are four discrete levels of charge.

Figure 3A:
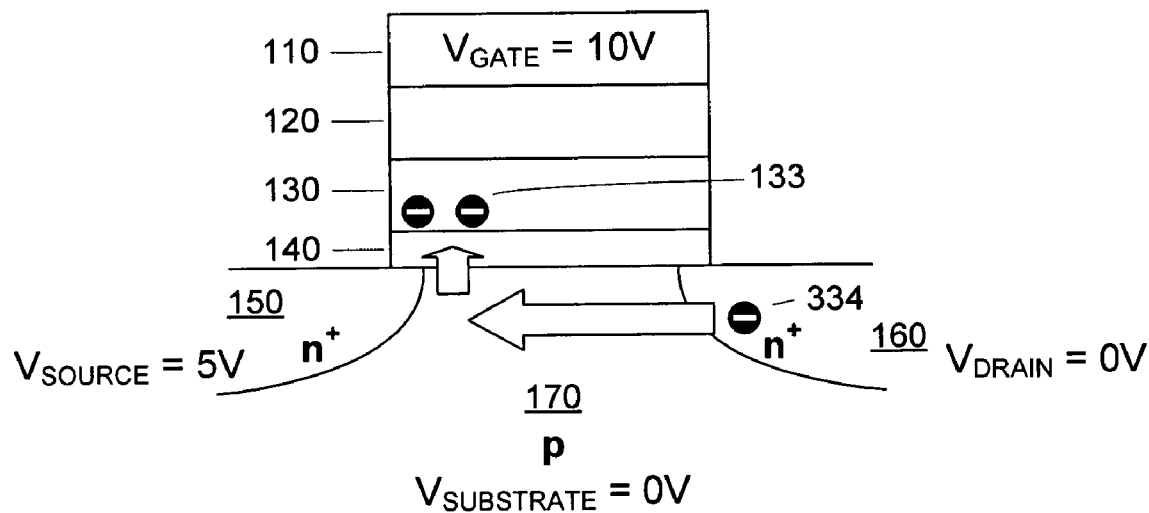
FIG. 3A is a simplified diagram of a charge trapping memory cell, showing channel hot electron injection being performed on one portion of the charge trapping structure.
Figure 3B:
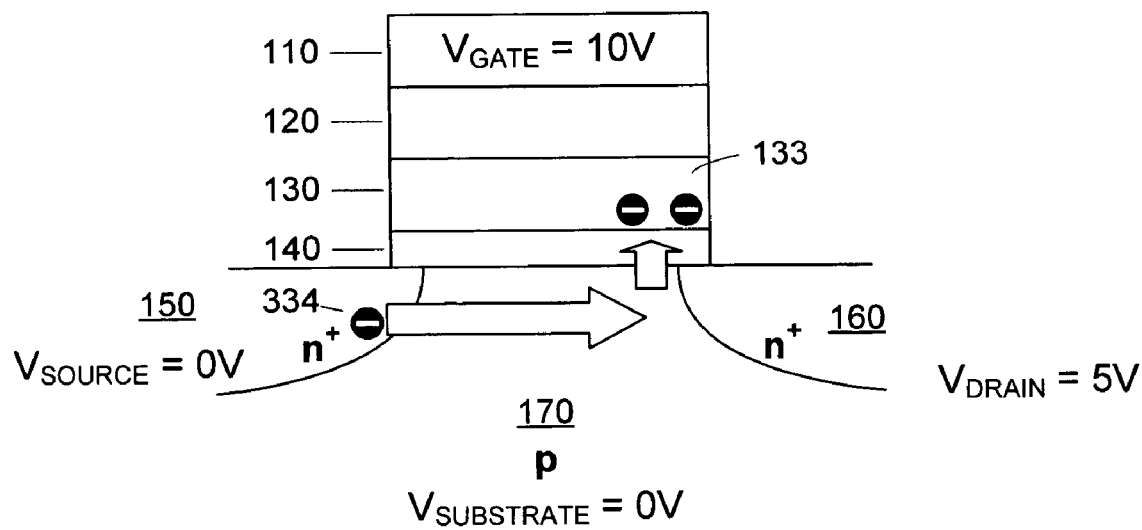
FIG. 3B is a simplified diagram of a charge trapping memory cell, showing channel hot electron injection being performed on another portion of the charge trapping structure.

FIGS. 3A and 3B are simplified diagrams of a charge trapping memory cell, showing channel hot electron injection being performed on different portions of the charge trapping structure. In the bias arrangement of FIG. 3A for adding electrons (334?) to the source side of the charge trapping structure 130, the voltage of the gate 110 is 10 V, the voltage of the source 150 is 5 V, the voltage of the drain 160 is 0 V, and the voltage of the substrate 170 is 0 V. The memory cell of FIG. 3B is similar to memory cell of FIG. 3A, except that electrons (334?) are added to the drain side of the charge trapping structure rather than on the source side. In the bias arrangement of FIG. 3B, the voltage of the gate 110 is 10 V, the voltage of the source 150 is 0 V, the voltage of the drain 160 is 5 V, and the voltage of the substrate 170 is 0 V.

Figure 4A:
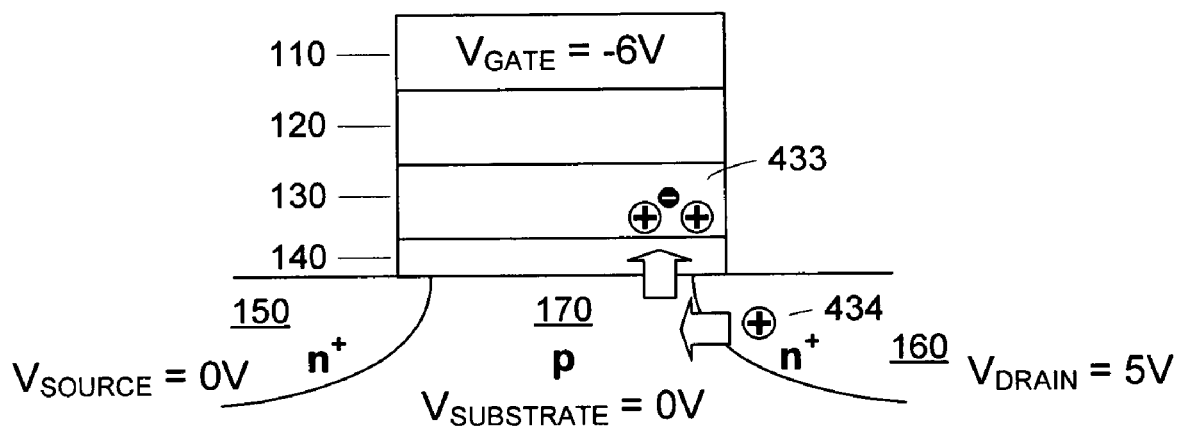
FIG. 4A is a simplified diagram of a charge trapping memory cell, showing band to band hot hole injection being performed on one portion of the charge trapping structure.
Figure 4B:
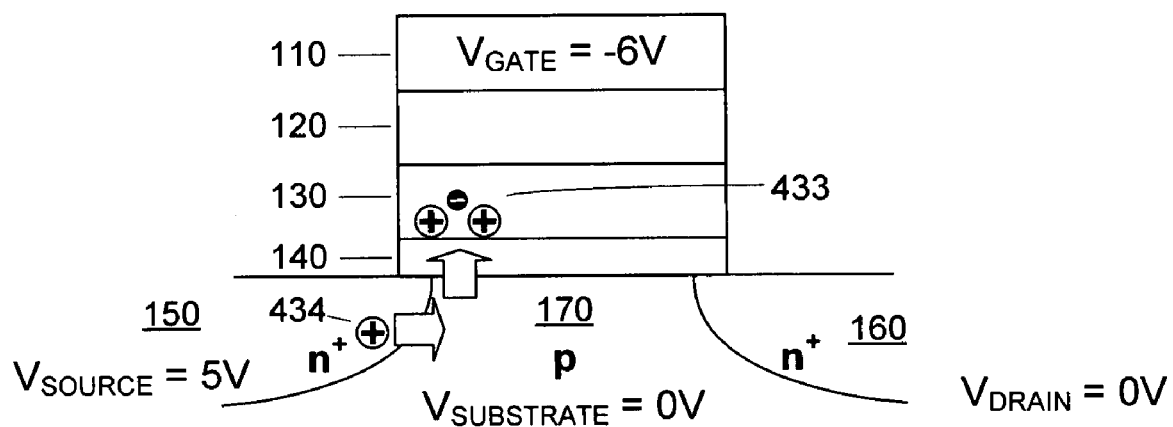
FIG. 4B is a simplified diagram of a charge trapping memory cell, showing band to band hot hole injection being performed on another portion of the charge trapping structure.

FIGS. 4A and 4B are simplified diagrams of a charge trapping memory cell, showing band to band hot hole injection being performed on different portions of the charge trapping structure. In the bias arrangement of FIG. 4A for adding holes 433 to the drain side of the charge trapping structure 130, the voltage of the gate 110 is −6 V, the voltage of the source 150 is 0 V, the voltage of the drain 160 is 5 V, and the voltage of the substrate 170 is 0 V. The memory cell of FIG. 4B is similar to memory cell of FIG. 4A, except that holes 433 are added to the drain side of the charge trapping structure rather than on the source side. In the bias arrangement of FIG. 4B, the voltage of the gate 110 is −6 V, the voltage of the source 150 is 5 V, the voltage of the drain 160 is 0 V, and the voltage of the substrate 170 is 0 V. In the simplified diagrams of FIGS. 4A and 4B, the stored charge 433 in the charge trapping structure, electrons are symbolically shown smaller than the holes to show that the injected holes have compensated previously injected electrons.

In some embodiments, programming refers to making more positive the net charge stored in the charge trapping structure, such as by the addition of holes to or the removal of electrons from the charge trapping; and erasing refers to making more negative the net charge stored in the charge trapping structure, such as by the removal of holes from or the addition of electrons to the charge trapping structure. However, in other embodiments programming refers to making the net charge stored in the charge trapping structure more negative, and erasing refers to making the net charge stored in the charge trapping structure more positive. Various charge movement mechanisms are used, such as band-to-band tunneling induced hot carrier injection, E-field induced tunneling, channel hot carrier injection, channel initiated substrate carrier injection, and direct tunneling from the substrate.

Figure 5A:
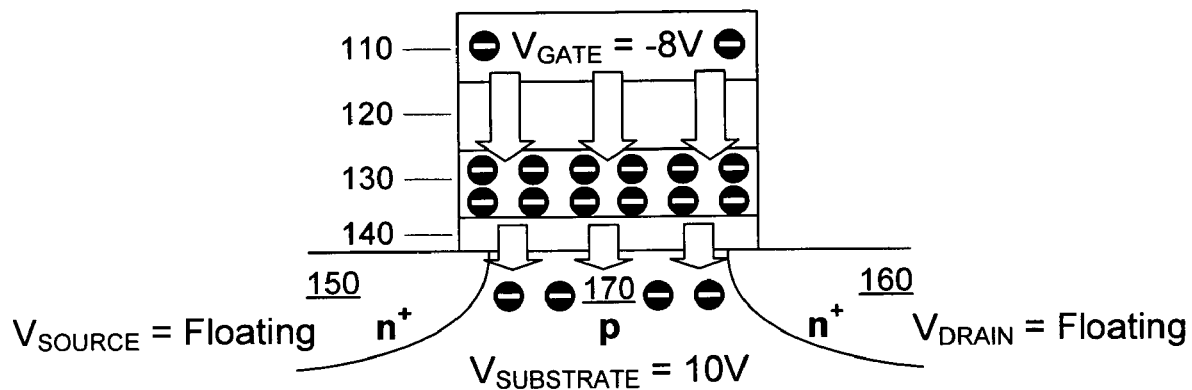
FIG. 5A is a simplified diagram of a charge trapping memory cell, showing an erase operation being performed on the charge trapping structure, corresponding to FIG. 5(?).
Figure 5B:
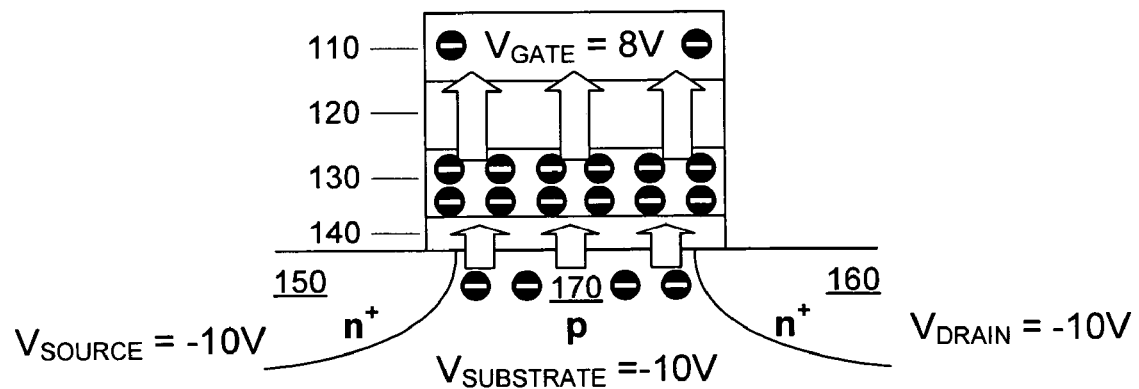
FIG. 5B is a simplified diagram of a charge trapping memory cell, showing an erase operation being performed on the charge trapping structure, corresponding to FIG. 6(?).

FIG. 5A and 5B are simplified diagrams of a charge trapping memory cell, showing an erase operation being performed on the charge trapping structure. In the bias arrangement of FIG. 5A for erasing the memory cell, the voltage of the gate 110 is −8 V, the voltage of the source 150 and the drain 160 is floating, and the voltage of the substrate 170 is 10 V. The memory cell of FIG. 5B is similar to memory cell of FIG. 5A, except for the direction of movement of the electrons. In the bias arrangement of FIG. 5B, the voltage of the gate 110 is 8 V, the voltage of the source 150 and the drain 160 is −10V, and the voltage of the substrate 170 is −10 V. The erase operations of FIGS. 5A and 5B, and the electron injection operation of FIGS. 3A and 3B are alternative electron movement mechanisms.

Figure 6:
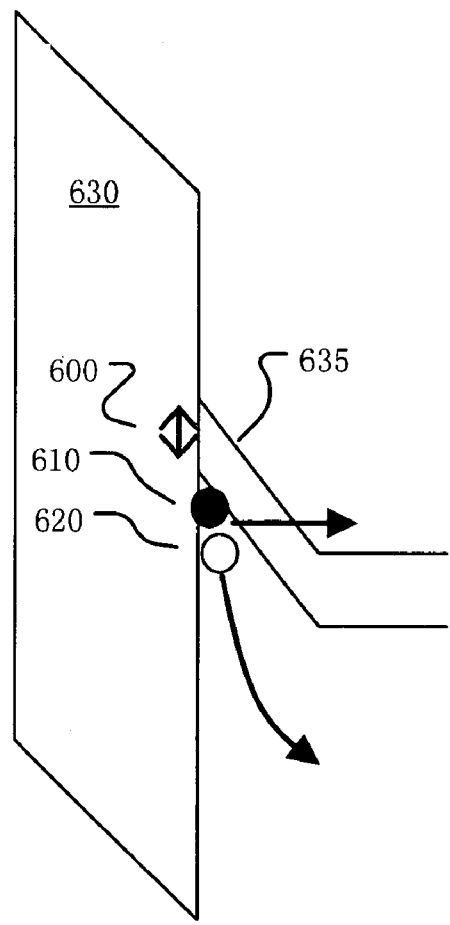
FIG. 6 is a simplified band diagram of an oxide and a substrate with a relatively small bandgap.
Figure 7:
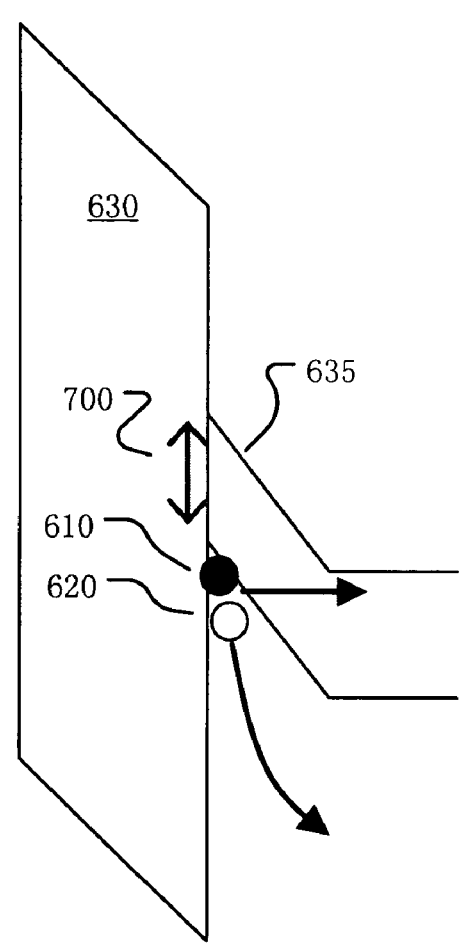
FIG. 7 is a simplified band diagram of an oxide and a substrate with a relatively large bandgap.

FIGS. 6 and 7 are simplified band diagrams of an oxide and a substrate with different bandgaps. An oxide 630 has a large forbidden region, and is adjacent to the substrate region 635. Charge 610 contributes to band-to-band current in the substrate region by tunneling between the valence band and the conduction band. Because the size of the bandgap affects the barrier width for tunneling, adjustment of the bandgap affects the magnitude of band-to-band current. Silicon has a bandgap of 1.1 eV. FIG. 6 is a simplified band diagram of an oxide and a substrate with a smaller bandgap of about 0.8 eV. Thus the structure of FIG. 6 supports an increased magnitude of band-to-band current relative to a silicon substrate. FIG. 7 is a simplified band diagram of an oxide and a substrate with a larger bandgap of about 1.5 eV. Thus the structure of FIG. 7 supports a decreased magnitude of band-to-band current relative to a silicon substrate.

Figure 8:
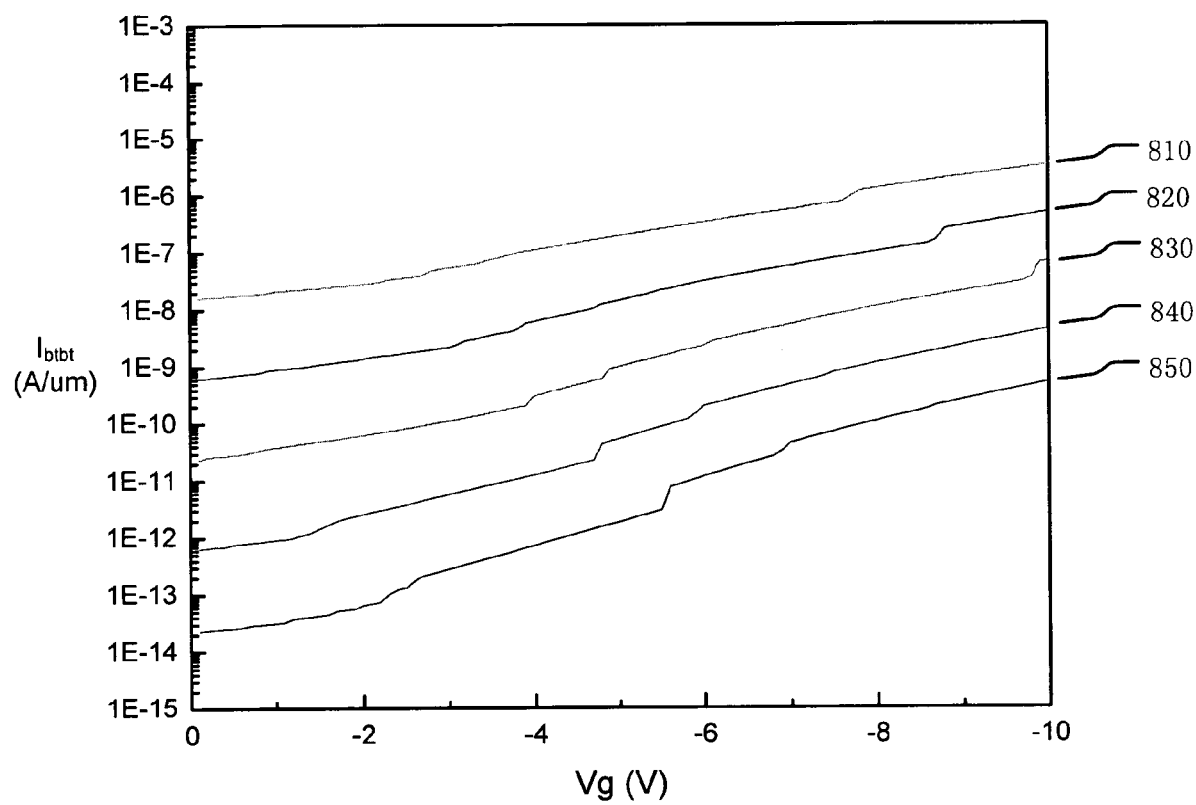
FIG. 8 is a graph showing the trend of increasing magnitudes of band-to-band current with decreasing bandgap and increasing field.

FIG. 8 is a graph showing the trend of increasing magnitudes of band-to-band current with decreasing bandgap and increasing field. With respect to each curve, an increased electrical field as represented by increasingly negative gate voltage results in a larger magnitude of band-to-band current. The following table shows the correspondence of each labeled curve with the associated band gap of the substrate region.

| Curve | Bandgap (eV) |
|---|---|
| 810 | 0.8 |
| 820 | 0.9 |
| 830 | 1.0 |
| 840 | 1.1 |
| 850 | 1.2 |

The preceding table shows bandgaps varying from 0.8 eV to 1.2 eV. One way such a range of different bandgaps is achievable by varying the composition of $Si_xGe_{1-x}$, to vary the bandgap between the 1.2 eV bandgap of silicon and the 0.66 eV bandgap of germanium.

As the bandgap decreases, thermal emission and impact ionization are enhanced. Thermal emission and impact ionization generate extra electrons and holes, which may increase the carrier density, current density, and programming efficiency. However, the leakage current is also increased by thermal emission and impact ionization. If the leakage current is acceptable, a low bandgap can be used to enhance memory performance.

Figure 9:
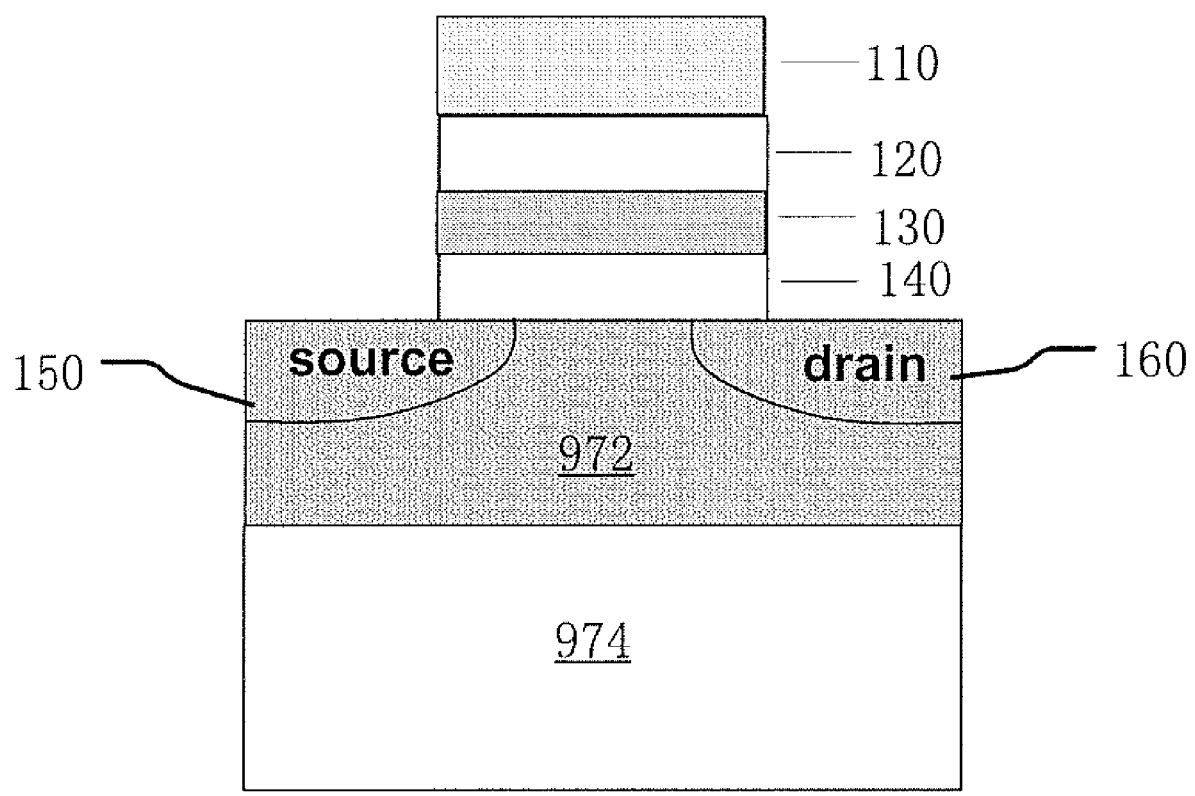
FIG. 9 is a simplified diagram of a nonvolatile memory cell showing a substrate with a first material for the source, drain, and channel regions, and a second material below.
Figure 10:
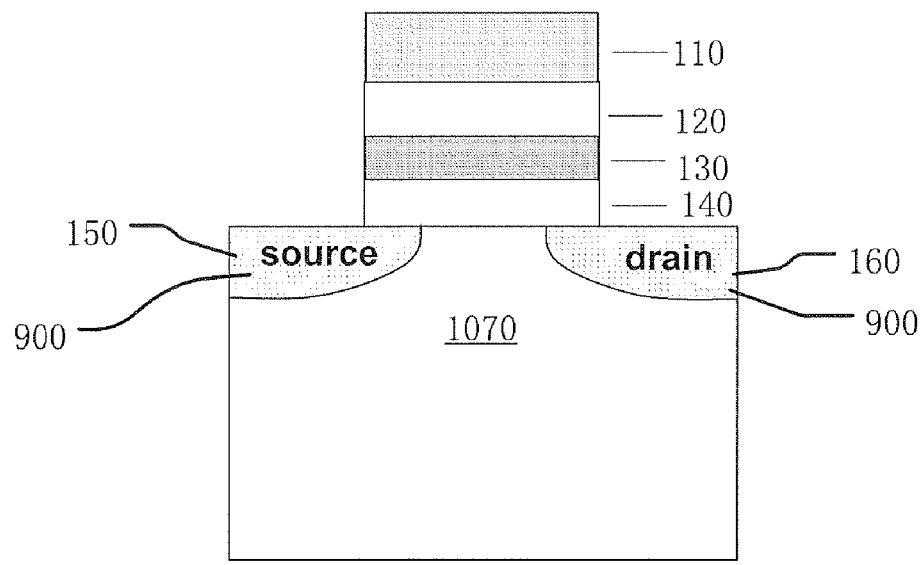
FIG. 10 is a simplified diagram of a nonvolatile memory cell showing a substrate with a first material for the source and drain regions, and a second material for the channel region and below.
Figure 11:
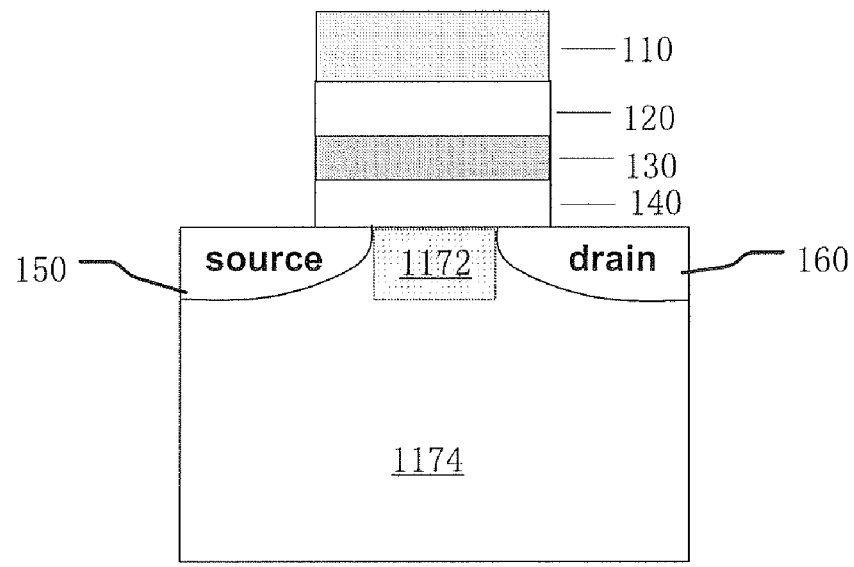
FIG. 11 is a simplified diagram of a nonvolatile memory cell showing a substrate with a first material for the channel region, and a second material for the source and drain regions and below.

FIGS. 9-11 are simplified diagrams of a nonvolatile memory cell showing a substrate region with different materials associated with different band structures. By varying the process flow, the relative locations of the different materials in the substrate region are varied. FIG. 9 is a simplified diagram of a nonvolatile memory cell showing a substrate with a first material 972 for the source, drain, and channel regions, and a second material 974 below. FIG. 10 is a simplified diagram of a nonvolatile memory cell showing a substrate with a first material 900 for the source and drain regions, and a second material 1070 for the channel region and below. FIG. 11 is a simplified diagram of a nonvolatile memory cell showing a substrate with a first material 1172 for the channel region, and a second material 1174 for the source and drain regions and below. The materials are more locally formed in the structures of FIGS. 10 and 11 relative to the structure of FIG. 9. Thus, in the structures of FIGS. 10 and 11, in order to form the material with a different material as compared to the bulk material of the substrate region, a local area of the bulk material is etched. For example, in FIG. 10, the source 150 and the drain 160 are etched, and in FIG. 11, the channel region 1172 is etched. Then, the etched region is deposited with the different material having a band structure different from the bulk part of the substrate region. Regardless of whether the different material is relatively uniform as in FIG. 9, or relatively local as in FIGS. 10 and 11, the different material can be a single material or multiple materials. An example of multiple materials is a stack of materials such as $Si/graded-SiGe/Si_xGe_{1-x}/strained silicon$.

Figure 12:
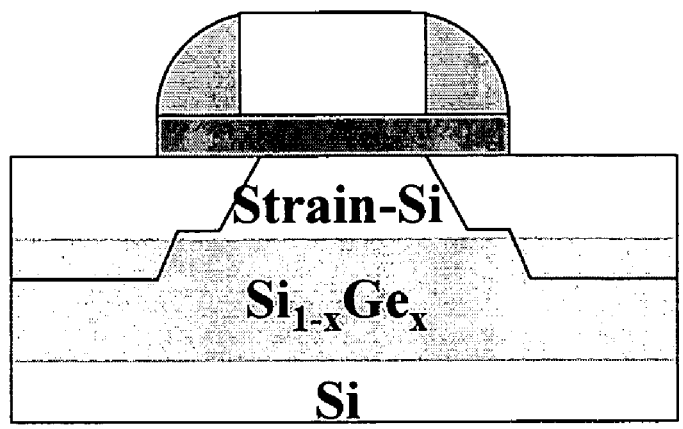
FIG. 12 is a simplified diagram of a nonvolatile memory cell showing a substrate with strained silicon.
Figure 13:
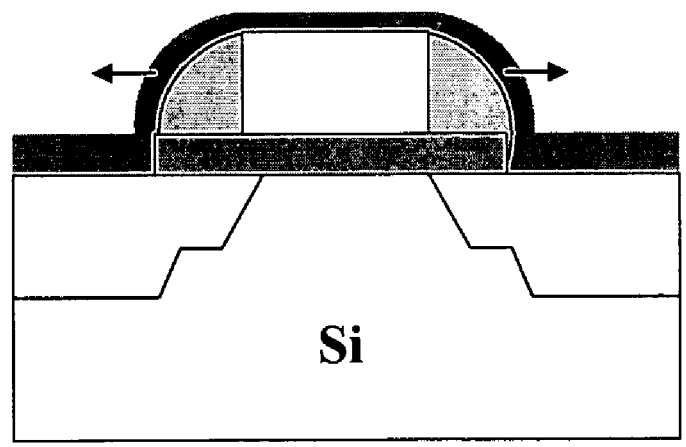
FIG. 13 is a simplified diagram of a nonvolatile memory cell with a film inducing strained silicon.

FIGS. 12 and 13 are simplified diagrams of a nonvolatile memory cell showing a substrate with strained silicon. FIG. 12 shows an example of biaxial strain. Biaxial strain decreases the bandgap. Accordingly, biaxial strain enhances the band-to-band current used for read operations enhances and programming speed. Biaxial strain can also increase the mobility, channel current, and Gm, which is beneficial for peripheral devices as well. Biaxial strain in silicon splits the conduction band between a higher effective mass fourfold degeneracy and a lower effective mass twofold degeneracy, resulting in effective lowered energy of most of the electron charge carriers. Biaxial strain in silicon removes the heavy hole/light hole degeneracy in the valence band between heavy holes and light holes.

FIG. 13 shows an example of uniaxial strain along the direction of the channel. Uniaxial strain performs different effects on NMOS and PMOS. If one uniaxial strain effect is good for NMOS, it is correspondingly bad for PMOS. In contrast, biaxial strain is good for both NMOS and PMOS. Generally, memory devices with an n-channel can be enhanced by uniaxial strain or biaxial strain, and memory devices with a p-channel can be enhanced by biaxial strain.

Figure 14A:
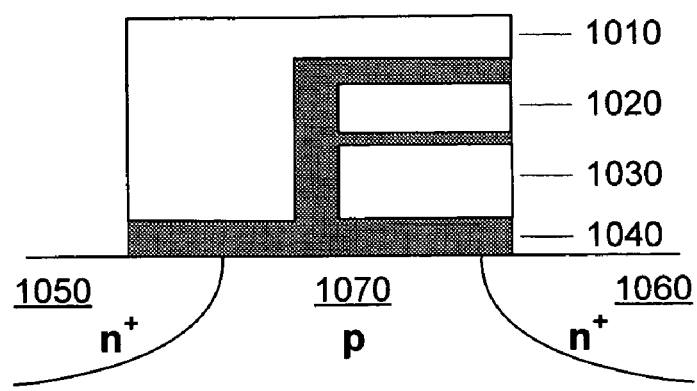
FIGS. 14A-14C are simplified diagrams of other nonvolatile memory cells with various charge storage structures.
Figure 14B:
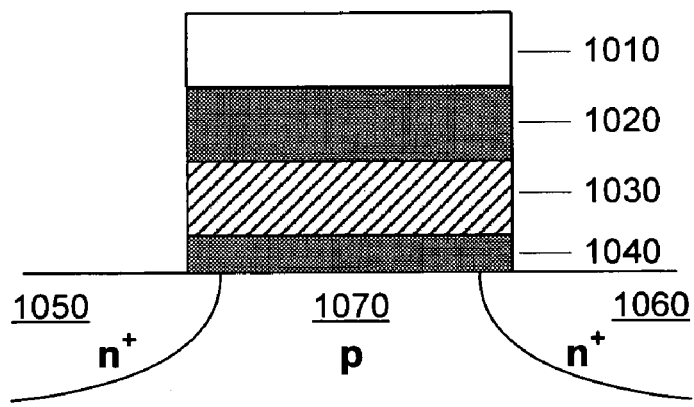
Figure 14C:
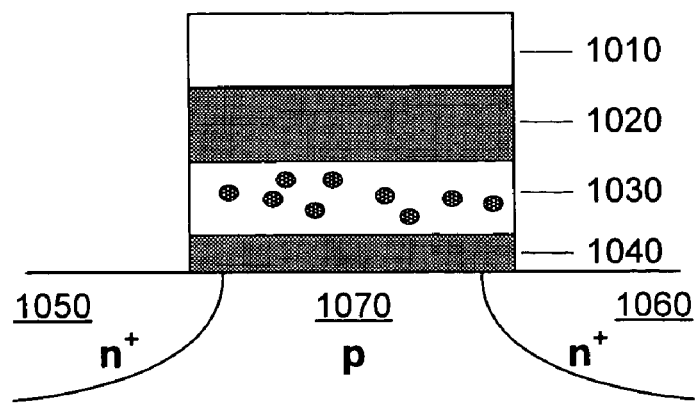

FIGS. 14A-14C show simplified diagrams of other nonvolatile memory cells with various charge storage structures. The p-doped substrate region 1070 includes n+ doped source and drain regions 1050 and 1060. FIG. 14A shows the structure of a split gate memory cell, with a first gate 1020, a second gate 1010, a charge storage structure 1030, and oxide 1040. FIG. 14B shows a nonvolatile memory cell resembling the nonvolatile memory cell of FIG. 1, but with a floating gate 1030, often made of polysilicon. FIG. 14C shows a nonvolatile memory cell resembling the nonvolatile memory cell of FIG. 1, but with a nanoparticle charge storage structure 1030.

Figure 15:
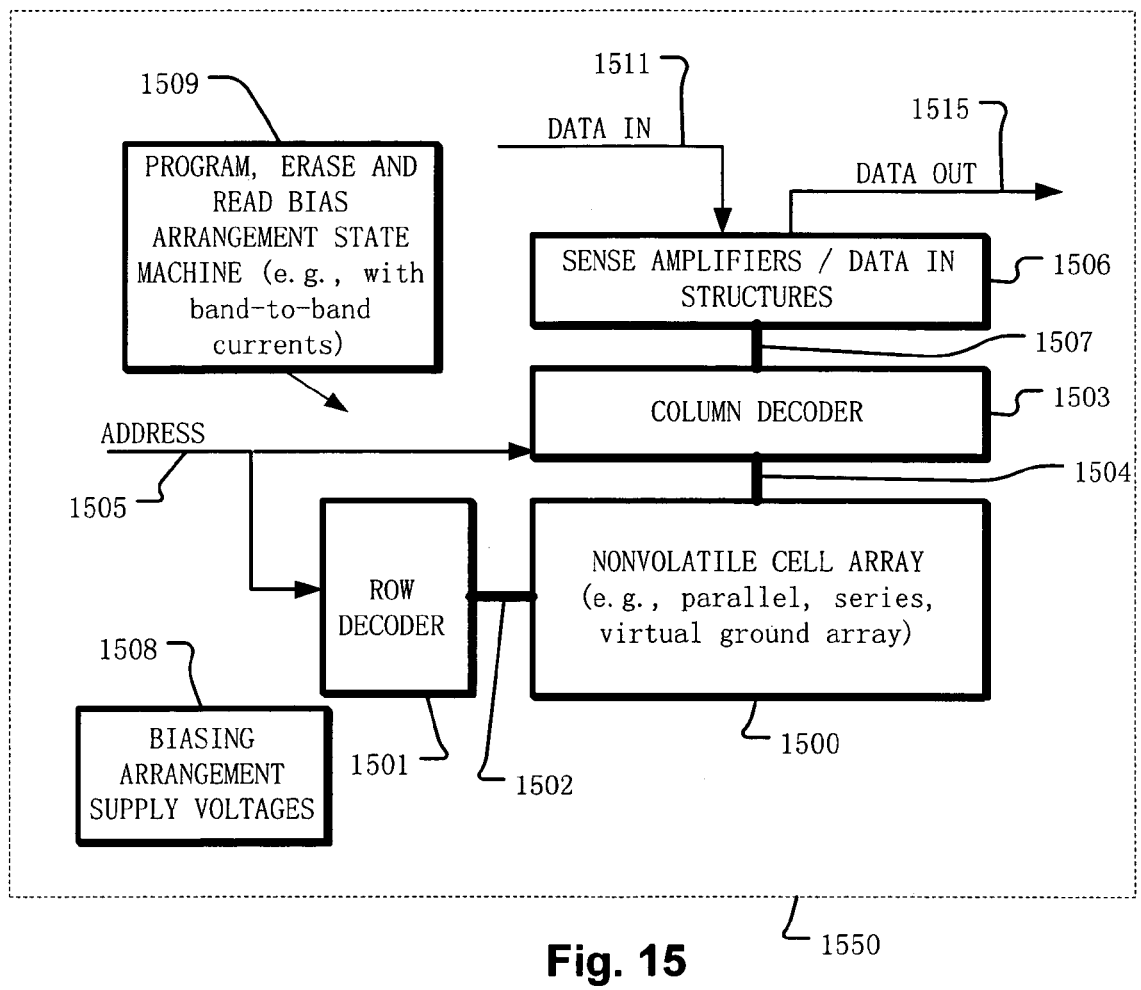
FIG. 15 is a simplified diagram of an integrated circuit with an array of charge trapping memory cells and control circuitry.

FIG. 15 is a simplified diagram of an integrated circuit with an array of charge storage memory cells and control circuitry. The integrated circuit 1550 includes a memory array 1500 implemented using nonvolatile memory cells, on a semiconductor substrate. The memory cells use band structure engineering technology as described herein. Optionally, any of the peripheral circuitry may also use band structure engineering technology as described herein. The memory cells of array 1500 may be interconnected in parallel, in series, or in a virtual ground array. A row decoder 1501 is coupled to a plurality of word lines 1502 arranged along rows in the memory array 1500. A column decoder 1503 is coupled to a plurality of bit lines 1504 arranged along columns in the memory array 1500. Addresses are supplied on bus 1505 to column decoder 1503 and row decoder 1501. Sense amplifiers and data-in structures in block 1506 are coupled to the column decoder 1503 via data bus 1507. Data is supplied via the data-in line 1511 from input/output ports on the integrated circuit 1550, or from other data sources internal or external to the integrated circuit 1550, to the data-in structures in block 1506. Data is supplied via the data-out line 1515 from the sense amplifiers in block 1506 to input/output ports on the integrated circuit 1550, or to other data destinations internal or external to the integrated circuit 1550. A bias arrangement state machine 1509 controls the application of bias arrangement supply voltages 1508, such as for the erase verify and program verify voltages, and the arrangements for programming, erasing, and reading the memory cells, such as with the band-to-band currents.

While the present invention is disclosed by reference to the technology and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. A nonvolatile memory, comprising:
   a substrate region including source and drain regions, wherein a bulk part of the substrate region has a first band structure, and a measurement part of the substrate region has a second band structure different from the first band structure;
   a charge storage structure;
   one or more dielectric structures at least partly between the charge storage structure and the substrate region and at least partly between the charge storage structure and a source of gate voltage;
   a gate providing the gate voltage; and
   logic applying a first bias arrangement to determine a charge storage state of the charge storage structure and measuring current flowing between the substrate region and at least one of the source region or the drain region to determine the charge storage state of the charge storage structure, wherein at least part of the current flows through the measurement part of the substrate region,
   wherein said logic further performs:
      applying a second bias arrangement to adjust the charge storage state by increasing a net positive charge in the charge storage structure; and
      applying a third bias arrangement to adjust the charge storage state by increasing a net negative charge in the charge storage structure.

2. The nonvolatile memory of claim 1, wherein the first band structure is associated with a first bandgap, the second band structure is associated with a second bandgap, and the second bandgap is less than the first bandgap.

3. The nonvolatile memory of claim 1, wherein the measurement part of the substrate region includes strained silicon.

4. The nonvolatile memory of claim 1, wherein the measurement part of the substrate region includes strained silicon, further comprising:
   a film causing strain in the strained silicon.

5. The nonvolatile memory of claim 1, wherein the measurement part of the substrate region includes $Si_xGe_{1-x}$ material.

6. The nonvolatile memory of claim 1, wherein the measurement part of the substrate region includes $Si_xC_{1-x}$ material.

7. The nonvolatile memory of claim 1, wherein the measurement part of the substrate region includes the source and drain regions.

8. The nonvolatile memory of claim 1, wherein the measurement part of the substrate region includes a channel part between the source and drain regions.

9. The nonvolatile memory of claim 1, wherein the substrate region further includes:
   a buried oxide part at least partly between the bulk part and the and the measurement part.

10. The nonvolatile memory of claim 1, wherein the first bias arrangement applies a voltage difference between the substrate region and one of the source region or the drain region, and floats the other of the source region or the drain region.

11. The nonvolatile memory of claim 1, wherein the first bias arrangement causes a first voltage difference between the gate and one of the source region and the drain region, and a second voltage difference between the substrate region and another of the source and drain regions, wherein the first voltage difference and the second voltage difference cause sufficient band-to-band tunneling current for said measuring, and the first voltage difference and the second voltage differences fail to change the charge storage state.

12. The nonvolatile memory of claim 1, wherein said measured current induced by the first bias arrangement includes at least a band-to-band current component.

13. The nonvolatile memory of claim 1, wherein the substrate region is a well in a semiconductor substrate.

14. The nonvolatile memory of claim 1,
   wherein the first band structure is associated with a first conduction band and a first valence band, the second band structure is associated with a second conduction band and a second valence band, and the first conduction band is different from the second conduction band.

15. The nonvolatile memory of claim 1,
   wherein the first band structure is associated with a first conduction band and a first valence band, the second band structure is associated with a second conduction band and a second valence band, and the first valence band is different from the second valence band.

16. The nonvolatile memory of claim 1, wherein said logic further performs:
   applying the second bias arrangement to adjust the charge storage state by increasing a net positive charge in the charge storage structure via band-to-band hot hole tunneling; and
   applying the third bias arrangement to adjust the charge storage state by increasing a net negative charge in the charge storage structure via channel hot electron injection current.

17. The nonvolatile memory of claim 1, wherein the charge storage state of each part of the charge storage structure stores one bit.

18. The nonvolatile memory of claim 1, wherein the charge storage state of each part of the charge storage structure stores multiple bits.

19. The nonvolatile memory of claim 1, wherein hot carriers generated during the first bias arrangement are insufficient to disturb the charge storage state.

20. The nonvolatile memory of claim 1, wherein the charge storage structure includes charge trapping material.

21. The nonvolatile memory of claim 1, wherein the charge storage structure includes nanocrystal material.

22. The nonvolatile memory of claim 1, wherein the charge storage structure includes floating gate material.

* * * * *